United States Patent [19]

O'Neil et al.

[11] 3,886,470

[45] May 27, 1975

[54] FEED-FORWARD AMPLIFIER SYSTEM

[75] Inventors: William A. O'Neil, Belmont; George H. Ray, Woburn, both of Mass.

[73] Assignee: Amplifier Design And Service, Inc., Waltham, Mass.

[22] Filed: Dec. 4, 1973

[21] Appl. No.: 421,734

[52] U.S. Cl. ........... 330/149; 330/30 R; 330/124 R; 330/151

[51] Int. Cl. ........................ H03f 1/26; H03f 1/00

[58] Field of Search ....... 330/149, 151, 124 R, 30 R

[56] References Cited

UNITED STATES PATENTS

| | | | |
|---|---|---|---|
| 3,471,798 | 10/1969 | Seidel | 330/149 |
| 3,628,162 | 12/1971 | Lunden | 330/124 R |
| 3,649,927 | 3/1972 | Seidel | 330/124 R |
| 3,667,065 | 5/1972 | Beurrier | 330/151 X |
| 3,789,314 | 1/1974 | Beurrier | 330/151 |

*Primary Examiner*—Stanley D. Miller, Jr.
*Attorney, Agent, or Firm*—Weingarten, Maxham & Schurgin

[57] ABSTRACT

A feed-forward amplifier system for producing a high output with low distortion and noise across a wide frequency band. An amplified signal is compared with a time-delayed unamplified signal in a sampling loop to isolate the noise and distortion components produced by the main amplifier. These noise and distortion components are then amplified by an auxiliary amplifier and combined with the amplified main signal to effectively cancel the error thereof. The output impedance of the main amplifier is completely mismatched with respect to the other components of the system and signals incident upon the output, although reflected off the main signal amplifier, do not reappear at the output because of the cancellation characteristic of the correction loop.

15 Claims, 2 Drawing Figures

FEED-FORWARD AMPLIFIER SYSTEM

FIELD OF THE INVENTION

The invention relates to amplifiers and more particularly to compact, highly stable low distortion, low noise amplifiers, these desirable characteristics being accomplished by means of feed-forward techniques.

DISCUSSION OF THE PRIOR ART

Feed-forward systems, in which amplifier generated noise and distortion components are isolated, amplified and then cancelled against the main amplified signal to provide an error free output, were basically conceived several decades ago but certain limitations have heretofore generally prevented their development and commercial use. A typical feed-forward amplifier is described in U.S. Pat. No. 3,471,798 which employs a transformer as an error injection network. The patent refers to the necessity of impedance matching between the various components in the feedforward system as well as between the feed-forward system and its output. Other prior patents deal with various aspects of feed-forward systems and their proposed useful applications.

Feed-forward amplifiers of the type discussed above use component main and auxiliary amplifiers which, it has been thought, should be carefully impedance matched to the other components of the feed-forward system. THis matching may be accomplished by either current or voltage feedback around the output stage of the component amplifiers or by simple resistive loading at the output. These techniques all consume signal power thereby reducing efficiency. Because of the power loss engendered by such matching techniques, more power must be delivered by the output amplifying device in order to achieve a specified output level. This requirement for higher power to be generated by the output amplifying device results in increased distortion.

Community antenna television (CATV) systems which provide multiple channel cable television services from a single transmission point through many lengths of cable and amplifiers to a plurality of individual subscribers, employ two types of amplifier systems, trunk amplifiers and distribution amplifiers. The trunk amplifiers are cascaded at selected intervals along the trunk line to compensate for transmission line attenuation, while the distribution amplifiers are connected in branches from the trunk line and are generally not cascaded, each providing an amplified signal for use by one or more customers connected to the branch.

The important quality of a distribution amplifier is its output capability. The optimal level at which a distribution amplifier is operated is at its highest possible level. This permits the maximum number of customers to be connected to a distribution branch of the CATV system and consequently reduces the cost of distributing the signal. As a result, distribution signal levels are usually much higher than those along the trunk, since the purpose of the trunk is only to deliver the information signal to the general locale of the customers. Consequently, the distortion produced by a single high gain distribution amplifier is usually much greater than that produced by a single low gain trunk amplifier. If amplifier-induced noise and distortion could be substantially reduced while still providing a high gain, an even larger number of subscribers could be serviced by each distribution branch at an overall increase in efficiency.

The trunk signal levels need not be changed while increasing the distribution level.

SUMMARY OF THE INVENTION

In this feed-forward amplifier system the received signal is applied to a pre-amplifier and then divided by a directional coupler. A portion of the signal is amplified in a main amplifier and the remainder of the signal is subject to a predetermined time delay. The output of the main amplifier is divided by a second directional coupler, the larger portion of the signal passing through a second time delay means to an output directional coupler. A fraction of the amplified signal is combined with the unamplified, time delayed input signal to provide a signal in which the main signal components cancel and only the noise and distortion components of the main amplifier output remain. This error signal is amplified by an auxiliary amplifier and is then combined through the output directional coupler with the output from the main amplifier, which has been suitably timedelayed, to produce a combined output signal in which the noise and distortion signals generated by the main amplifier have been cancelled.

The main signal component amplifier of this system is impedance mismatched with the remainder of the components of the system and with the output transmission line. Any signals incident upon the output terminal are reflected from the main component amplifier output and are effectively cancelled by the correction loop. By employing a mismatched amplifier, loading of the amplifier for matching purposes is avoided and substantially the entire output of the main component amplifier, except for that portion used for error correction, is provided at the system output, thus permitting great efficiency in the delivery of the signal to customers.

CATV amplifiers are subject to wide extremes of temperature and are expected to remain operative and stable for extended periods of time. It is imperative in feed-forward systems that the sampling and correction loops remain amplitude and phase stable with respect to each other over the entire band of frequencies employed in the system. THe component amplifiers are largely comprised of integrated circuit devices whose uniformity, compactness and stability enable full utilization of feed-forward techniques in these adverse operating environments. Rigid coils of solid sheath miniature coaxial cable lengths are used for the delay lines of the system. These coils have a predictable time delay and are temperature stable, thereby facilitating production of the compact feed-forward amplifying system of this invention. Other temperature compensating components are also employed to offset any remaining errors associated with temperature changes.

While this application is concerned with a feed-forward amplifier specifically for CATV use, it is equally applicable wherever high performance amplifiers are required. One other example is in microwave point-to-point transmission systems where power output and low distortion are important.

BRIEF DESCRIPTION OF THE DRAWING

The advantages, objects and features of this invention will be fully apparent from the following detailed description taken in conjunction with the attached drawing in which.

DETAILED DESCRIPTION OF THE INVENTION

Figure 1:
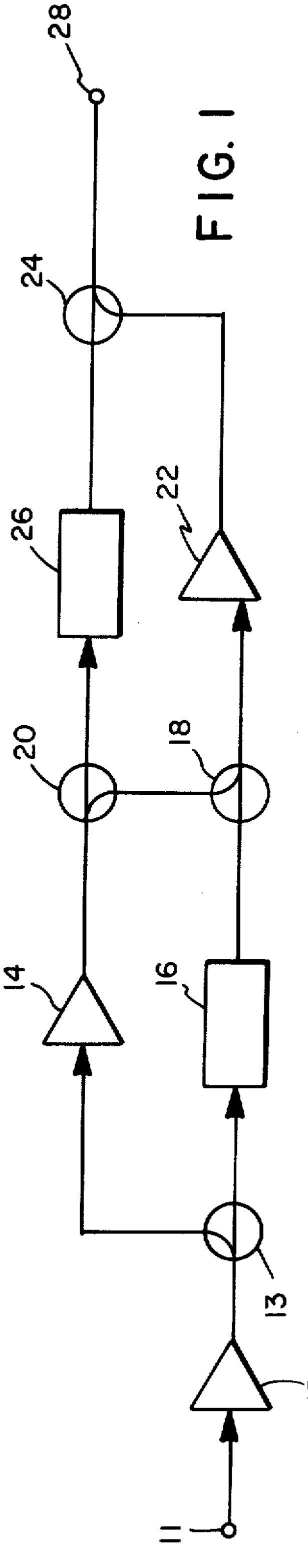
FIG. 1 is a schematic block diagram of the amplifier system in accordance with this invention.

A feed-forward amplifier suitable for use as a distribution amplifier in a CATV system and operative to provide a suitable response over the frequency band from 50 mHz to 300 mHz is shown in FIG. 1.

A received signal, such as from a CATV trunk line, is applied to input terminal 11 and is amplified by pre-amplifier 12. The signal from pre-amplifier 12 is then split by a directional coupler 13 which supplies approximately 1/10 of the signal power to a main component amplifier 14 and approximately 9/10 of the signal through a time delay circuit 16 in the sampling loop to combining directional coupler 18. Noise and distortion are inherently added to the desired signal by main component amplifier 14 which error ideally should be removed. The output signal from main amplifier 14 passes through a splitting directional coupler 20. The signal from coupler 20 is combined with the signal from delay line 16 by directional coupler 18 to provide a pure error signal. The portion of the main amplified signal which is combined with the unamplified signal by coupler 18 is adjusted to a level whereby the combining signals are equal in magnitude but opposite in phase. Since there is a 180° phase difference, the information signal cancels leaving only the noise and distortion signals introduced by the main amplifier. It may be appreciated that time delay circuit 16 is provided to ensure that the signal through it can be combined in the proper phase relationship with the signal from the main amplifier which has an inherent time delay.

The error signal from directional coupler 18 goes to an auxiliary component amplifier 22 in the correction loop to output directional coupler 24, which is a combining coupler. The main signal from amplifier 14 passes through time delay circuit 26, which has the same function as delay line 16, to coupler 24 where it combines with the amplified error signal from amplifier 22. Because of a 180° phase difference between the signals being combined by coupler 24, the error portion of the main signal is thereby cancelled and only the desired information signal appears at output terminal 28. The couplers are conventional devices and are highly directional in function so that no significant stray signals are likely to be formed around the loops of the system traveling in reverse direction. There is thus full isolation between the legs of the loops provided by the couplers.

The system is designed for a complete mismatch at the output of the main amplifier. By deliberately mismatching the main amplifier output, a maximum amount of its power may be realized at output terminal 28. No power is absorbed through attempts at matching, which would normally be accomplished either by feedback around the output stage or by brute force loading at the output.

It is desirable that the feed-forward amplifier system of this invention be matched to the following cable so that any signal incident upon the output of the amplifier from the cable is absorbed by the amplifier. Because of the characteristics of the directional couplers shown, most of any such incident signal goes through delay line 26 and coupler 20, and is presented with a complete mismatch at the output of the main component amplifier. These waves are then completely reflected and can be regarded as an error signal similar to the noise and distortion products of the main component amplifier and are thus cancelled by the correction loop. Since these incident signals do not reappear at output terminal 28, a match is thereby achieved.

Operation of the amplifier system, which has been described in general terms hereinabove, will now be discussed in greater detail. Pre-amplifier 12 uses a conventional arrangement in an integrated circuit together with some discrete components for control purposes. The purpose of the pre-amplifier is to raise the signal level to a desired point and to align the entire feed-forward amplifier system to the total amplification requirements. The feed-forward aspect of this amplifier system, which includes the sampling and correction loops within which are component amplifiers 14 and 22 respectively, is aligned as to the cancellation function of the various loops, and its total gain is thereby fixed. Therefore, if the total gain desired from the system differs from the gain-provided by the feed-forward section, pre-amplifier 12 is able to account for these differences. Since output levels must be finally adjusted in the field upon installation of the amplifier, it is also necessary to have controls to provide this capability located in the pre-amplifier. For example, there is a gain control and a selectable equalizer which permit individual tailoring of the amplifier frequency response needed at any particular location.

Approximately nine-tenths of the signal power applied to directional coupler 13 is directed through the delay line branch of the sampling loop while the remaining signal is applied to main component amplifier 14. The main component amplifier's primary function is to amplify the signal but in doing so it unavoidably generates noise and distortion errors in addition to the main signal and it is the purpose of this invention to reduce such amplifier-generated error signals. Approximately one-tenth of the signal power from amplifier 14 is fed to directional coupler 18 by directional coupler 20. Delay line 16 balances the time delay of the main component amplifier path so that the signals arriving at combining coupler 18 produce cancellation of the main signal. The total phase shift of the main component amplifier path must be 180° with respect to the sampling path through delay line 16 over the entire band of interest so that only error signals are applied to auxiliary amplifier 22.

Meanwhile the amplified signal from amplifier 14 passes through delay line 26 to output coupler 24 where it is combined with the output of amplifier 22. The level of the signal output of amplifier 22 is adjusted to exactly equal the error components accompanying the main signal passing through delay line 26 so that when these two components are combined by coupler 24, the error portions are cancelled out and only amplified information signal components appear at output terminal 28.

Figure 2:
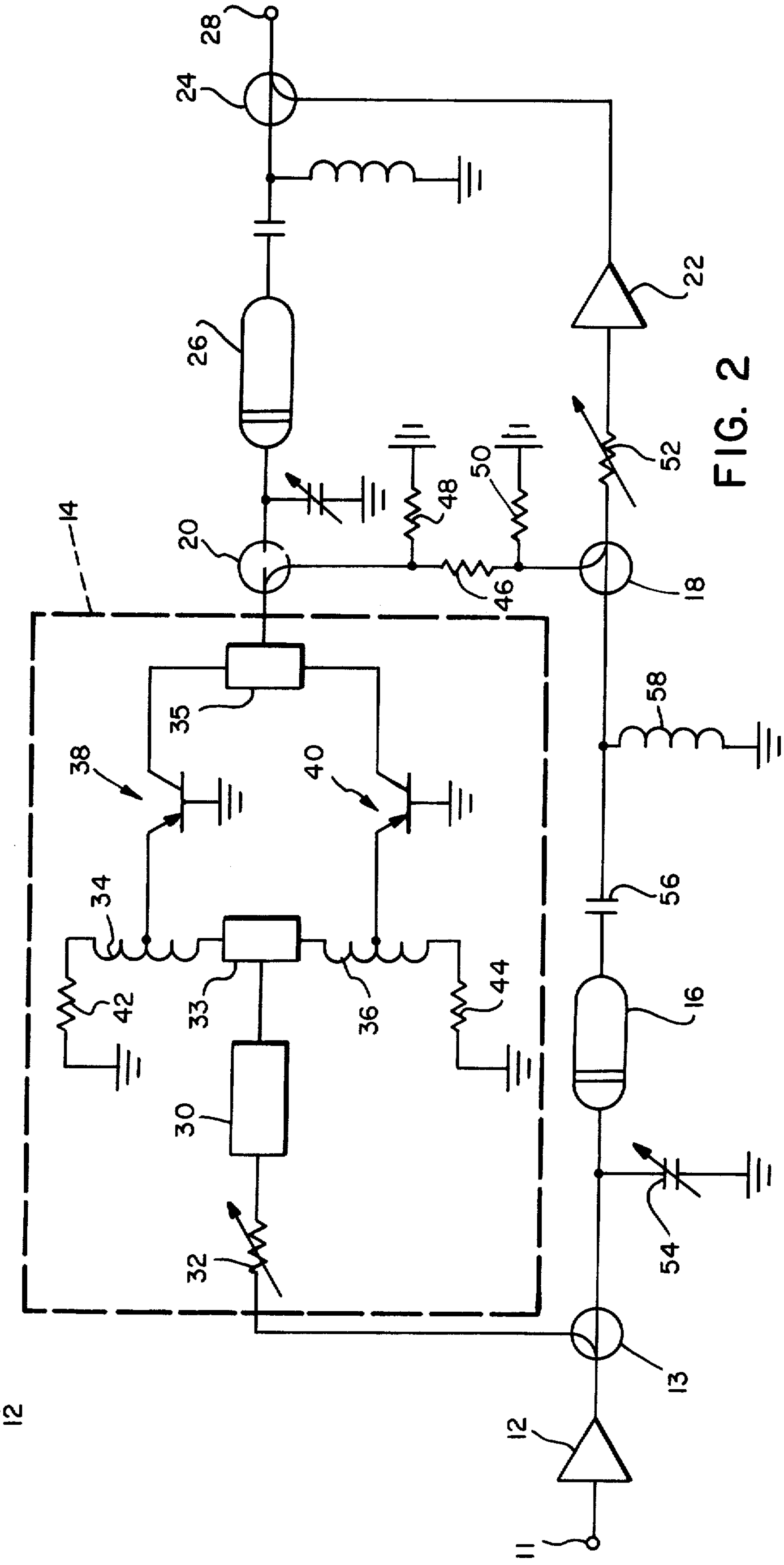
FIG. 2 shows further details of the circuitry of FIG. 1.

With specific reference to FIG. 2, there may be seen certain details of the amplifier system which bear further scrutiny. Preceding the integrated circuit amplifier 30 of the main component amplifier 14 is variable gain control 32 which is employed for fine gain adjustment of the main amplifier path. At the output of the integrated circuit amplifier the signal is split by the hybrid splitter 33 and feeds a parallel pair of grounded base transistors. Connection to the emitters is accomplished by means of center tapped transformers 34 and 36 to which are connected the emitters of transistors 38 and 40 respectively. As long as the emitter presents a low impedance to the transformer, such an input connection provides a current gain of two from the input to the emitter and a good input match by virtue of the one-to-one transformation of resistors 42 and 44. The bases of each of the transistors is grounded while the collectors are combined by hybrid combiner 35 and drive the input of directional coupler 20. This configuration of the component amplifier output presents a virtual open circuit to any signals which may return down the line from output terminal 28, and permits all the signal current circulating in the transistor collector to be delivered to the input of coupler 20.

Between directional couplers 20 and 18 is a pi resistance pad comprising resistors 46, 48 and 50, which is provided for coarse signal strength adjustment between the signal paths entering coupler 18. Auxiliary amplifier 22 is preceded by variable gain control 52 which functions similarly to variable gain control 32 preceding the main amplifier. That is, gain control 52 is a fine gain adjustment to ensure that the signal level of amplifier 22 is such that the error signal at coupler 24 is fully cancelled.

Delay lines 16 and 26 are formed of solid sheath rigid miniature coaxial cable formed in a relatively small coil of approximately 6 feet of the cable. Solid sheath coaxial cable has a phase temperature co-efficient which is much more stable than is the braided sheath flexible type of coaxial cable, which makes the solid sheath cable particularly suitable for the present invention where the amplifier must operate in relatively severe ambient conditions, normally being mounted to poles outside of any building structure. This coaxial cable has a very low loss and the temperature co-efficient of the delay characteristic is not only small but quite predictable. Furthermore, as would be expected the phase transmission is linear (constant delay) over the frequency band of interest, 50–300 mHz. A small variable capacitor 54 in shunt precedes delay line 16 and functions as a very fine phase adjustment whose dominant effect occurs at the high frequencies. A shunt coil 58 and series capacitor 56 are also shown in the delay path and their function is to provide a small correction to the phase characteristic of the delay path whose dominant effect occurs at the low frequencies.

These phase correcting networks are necessary to match small departures from linear phase transmission that occur in the main amplifier path. Similar phase correcting networks, as shown, could be employed in the time delay 26 path to match the phase properties of the amplifier 22 path.

The integrated circuit amplifier 30 may be a conventional integrated circuit such as the model CA601B manufactured by TRW, but other particular devices having the desired characteristics may be used. For this particular application, integrated circuits provide capabilities which would be impossible with discrete components or tubes. These particular electronic devices are very consistent from unit to unit and they have extremely good stability over long periods of time and with temperature changes. Their bandwidths are well in excess of 300 mHz, and they possess generally flat amplitude characteristics and linear phase vs. frequency characteristics over the frequency band of interest. These integrated circuits are, of course, highly compact and use very little power considering the performance achieved. Similar integrated circuits may be used in pre-amplifier 12 and auxiliary amplifier 22. The directional couplers 13, 18, 20 and 24 are also fabricated using conventional techniques.

Integrated circuit amplifiers which are used in this system are made according to specifications which require stability between minus 40°F and plus 140°F. By employing integrated circuit amplifiers such as these and the highly stable solid sheath coaxial cable delay lines it is possible to construct the sampling loop and the cancellation loop having the smallest possible variation with temperature and time and to have any such variations track consistently together so that the operative function of cancelling the error signal is not adversely affected.

It is likely that modifications and improvements would occur to those skilled in the art which are within the scope of this invention. As an example, the system would function as described with only a single grounded base transistor output for main component amplifier 14.

What is claimed is:

1. A feed-forward amplifier system comprising:

means for applying an input information signal to said amplifier;

a first directional coupler for splitting the input signal;

a main component amplifier for amplifying a portion of the input signal from said directional coupler;

a second directional coupler at the output of said main component amplifier for splitting the amplified information signal;

a third directional coupler for combining the unamplified portion of the input information signal sampled by said first directional coupler and the small portion of the amplified signal from the main component amplifier and said second directional coupler;

an auxiliary component amplifier for amplifying the combined signal from said third directional coupler;

a fourth directional coupler for combining the output from said auxiliary component amplifier and the main portion of the amplified signal from said second directional coupler;

first delay means for delaying the unamplified input information signal between said first and third directional couplers by a predetermined time equal to the delay in the main component amplifier signal path; and an output terminal coupled to said fourth directional coupler;

said main component amplifier and siad first delay means being part of a sampling loop of said amplifier system; said auxiliary amplifier being part of a correction loop of said amplifier system;

whereby noise and distortion errors injected by said main component amplifier are cancelled by means of the correction loop through said auxiliary amplifier when the auxiliary amplified signal is combined with the main signal at said fourth coupler; and wherein the output impedance of said main component amplifier is mismatched with respect to the other elements in said feed-forward amplifier system so that signals injected at said output terminal are reflected by said main component amplifier and cancelled by means of said correction loop, thereby matching the output of said feed-forward amplifier system to a transmission line to which said output terminal is connected.

2. The feed-forward amplifier system recited in claim 1 wherein said first delay means further includes phase correcting means comprising:

a variable capacitor in shunt between said first directional coupler and said first coaxial cable coil;

a shunt coil between said first coaxial cable coil and said third directional coupler; and a series capacitor also between said first coaxial cable coil and said third directional coupler.

3. The feed-forward amplifier system recited in claim 1 and further comprising second delay means for delaying the main portion of the amplified signal between said second and fourth directional couplers by a predetermined time equal to the delay in the error signal in the auxiliary component amplifier signal path, said second delay means including a second rigid coil of solid sheath coaxial cable.

4. The feed-forward amplifier system recited in claim 3 wherein said second delay means further includes phase correcting means comprising:

a variable capacitor in shunt between said second directional coupler and said second coaxial cable coil;

a shunt coil between said second coaxial cable coil and said fourth directional coupler; and a series capacitor also between said second coaxial cable coil and said fourth directional coupler.

5. The feed-forward amplifier system recited in claim 1 wherein said main component amplifier comprises:

an integrated circuit amplifier;

a first grounded base transistor connected between said integrated circuit amplifier and said second directional coupler thereby making the effective output impedance of said main component amplifier represent substantially an open circuit, the output impedance of said main component amplifier thereby being mismatched with respect to the other elements of said feed-forward amplifier system.

6. The feed-forward amplifier system recited in claim 5 wherein said main component amplifier further comprises;

a second grounded base transistor connected in parallel with said first transistor.

7. The feed-forward amplifier system recited in claim 6 wherein said main component signal amplifier further comprises a variable gain control connected between said first directional coupler and said integrated circuit amplifier.

8. The feed-forward amplifier system recited in claim 7 wherein said auxiliary component amplifier comprises:

an auxiliary integrated circuit amplifier; and a variable gain control connected between said third directional coupler and said auxiliary integrated circuit amplifier.

9. The feed-forward amplifier system recited in claim 1 wherein said main component amplifier comprises:

an integrated circuit amplifier;

a signal splitter connected to the output of said integrated circuit amplifier;

a first center tapped transformer connected to one output port of said signal splitter;

a second center tapped transformer connected to the other output port of said signal splitter;

first and second grounded base transistors connected to the center taps of said first and second transformers respectively; and a signal combiner connected between said transistors and said second directional coupler.

10. A feed-forward amplifier system comprising:

means for applying an input information signal to said amplifier;

a first directional coupler for splitting the input signal;

a main component amplifier for amplifying a portion of the input signal from said directional coupler;

a second directional coupler at the output of said main component amplifier for unequally splitting the amplified information signal;

a third directional coupler for combining the unamplified portion of the input information signal sampled by said first directional coupler and the small portion of the amplified signal from the main component amplifier and said second directional coupler;

an auxiliary component amplifier for amplifying the combined signal from said third directional coupler;

a fourth directional coupler for combining the output from said auxiliary component amplifier and the main portion of the amplified signal from said second directional coupler; and an output terminal coupled to said fourth directional coupler;

said main component amplifier being part of a sampling loop of said amplifier system; said auxiliary amplifier being part of a correction loop of said amplifier system;

said main component amplifier comprises:

an integrated circuit amplifier;

a first grounded base transistor connected between said integrated circuit and said second directional coupler thereby making the effective output impedance of said main component amplifier represent substantially an open circuit, the output impedance of said main component amplifier thereby being mismatched with respect to the other elements of said feed-forward amplifier system.

11. A feed-forward amplifier system recited in claim 10 wherein said main component amplifier further comprises:

a second grounded base transistor connected in parallel with said first transistor.

12. A feed-forward amplifier system recited in claim 11 wherein said main component amplifier further comprises:

a signal splitter connected to the output of said integrated circuit amplifier;

a first center tapped transformer connected to one output port of said signal splitter;

a second center tapped transformer connected to the other output port of said signal splitter, said transistors being connected to the respective center taps of said transformers; and a signal combiner connected between said transistors and said second directional coupler.

13. The feed-forward amplifier system recited in claim 12 and further comprising:

first delay means for delaying the unamplified input information signal between said first and third directional couplers by a predetermined time equal to the delay in the main component amplifier signal path, said first delay means including a first rigid coil of solid sheath coaxial cable; and second delay means for delaying the main portion of the amplified signal between said second and fourth directional couplers by a predetermined time equal to the delay in the error signal in the auxiliary amplifier signal path, said second delay means including a second rigid coil of solid sheath coaxial cable.

14. The feed-forward amplifier system recited in claim 13 wherein said first and second delay means further include phase correcting means comprising:

a variable capacitor connected in shunt to the input of each of said coaxial cable coils;

a shunt coil connected at the output of each of said coaxial cable coils; and a series capacitor also connected at the output of each of said coaxial cable coils.

15. The feed-forward amplifier system recited in claim 14 and further comprising a pi resistance pad connected between said second and third directional couplers to provide for coarse signal strength adjustment of the signals entering said third directional coupler.

* * * * *